United States Patent [19]
Perry et al.

[11] Patent Number: 6,110,797
[45] Date of Patent: Aug. 29, 2000

[54] PROCESS FOR FABRICATING TRENCH ISOLATION STRUCTURE FOR INTEGRATED CIRCUITS

[75] Inventors: Jeff Perry, Cupertino; Albert Bergemont, Palo Alto, both of Calif.

[73] Assignee: National Semiconductor Corporation, Santa Clara, Calif.

[21] Appl. No.: 09/455,105

[22] Filed: Dec. 6, 1999

[51] Int. Cl.[7] .................................................. H01L 21/76
[52] U.S. Cl. ........................ 438/424; 438/221; 438/359
[58] Field of Search .................................. 438/424, 207, 438/221, 389

[56] References Cited

U.S. PATENT DOCUMENTS

| | | | |
|---|---|---|---|
| 4,551,911 | 11/1985 | Sasaki et al. | 29/576 |
| 4,631,803 | 12/1986 | Hunter et al. | 29/576 |
| 5,298,450 | 3/1994 | Verret | 438/221 |
| 5,691,232 | 11/1997 | Bashir et al. | 438/424 |
| 5,895,253 | 4/1999 | Akram | 438/424 |
| 6,020,230 | 1/2000 | Wu | 438/424 |

OTHER PUBLICATIONS

Yamaguchi, T., et al., "Process Investigations for a 30–GHz fT Submicrometer Double Poly–Si Bipolar Technology" IEEE Transactions on Electron Devices, 41:3 pp. 321–329 (Mar. 1994).

Blair, C., Deep Trench Isolation Structure And Process For BiCMOS Technologies, Co-pending U.S. Application 09/371,638 filed Aug. 11, 1999.

*Primary Examiner*—Charles Bowers
*Assistant Examiner*—David S. Blum
*Attorney, Agent, or Firm*—Limbach & Limbach L.L.P.

[57] ABSTRACT

A trench isolation structure featuring a shallow trench overlying a deep trench is fabricated avoiding creation of irregularities on the deep trench sidewalls. Such sidewall irregularities are conventionally associated with interaction between etchant and unexposed positive photoresist formed at the bottom of the deep trench during prior shallow trench photolithography steps. In one embodiment of the present invention, a deep trench is created and then a positive photoresist mask is patterned. The positive photoresist mask is utilized to etch a barrier selective to underlying single crystal silicon in anticipated shallow trench regions. Once the barrier has been removed, the positive photoresist mask is stripped, removing any unexposed positive photoresist remaining within the deep trench. Single crystal silicon revealed by removal of the barrier is etched to create the shallow trench, with remaining barrier material sacrificed to protect the underlying surface against this etching. In an alternative embodiment, a negative photoresist mask is employed during shallow trench photolithography, with development of the negative photoresist effective to remove the photoresist from the deep trench.

16 Claims, 7 Drawing Sheets

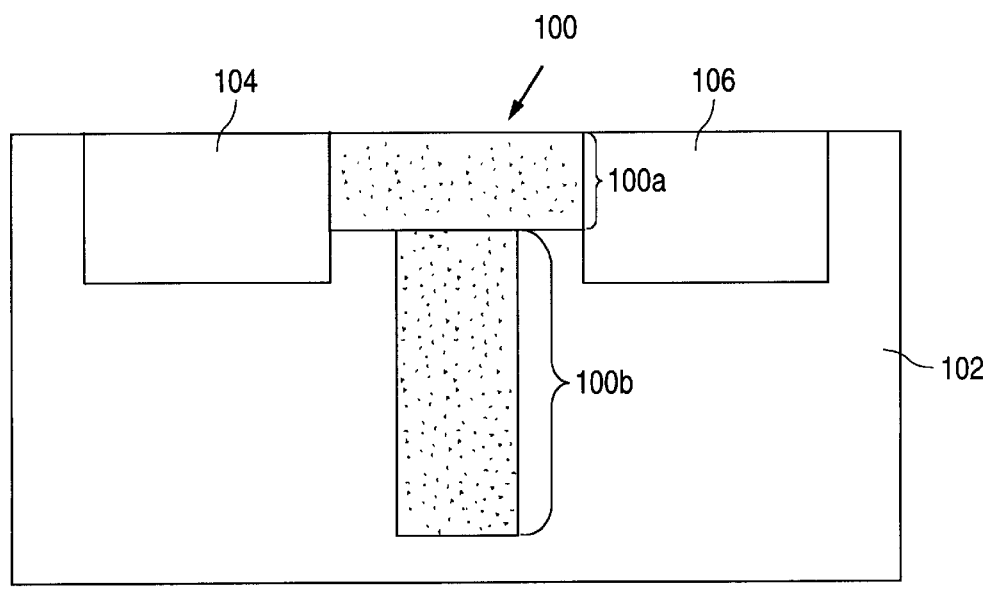
FIG. 1
(PRIOR ART)
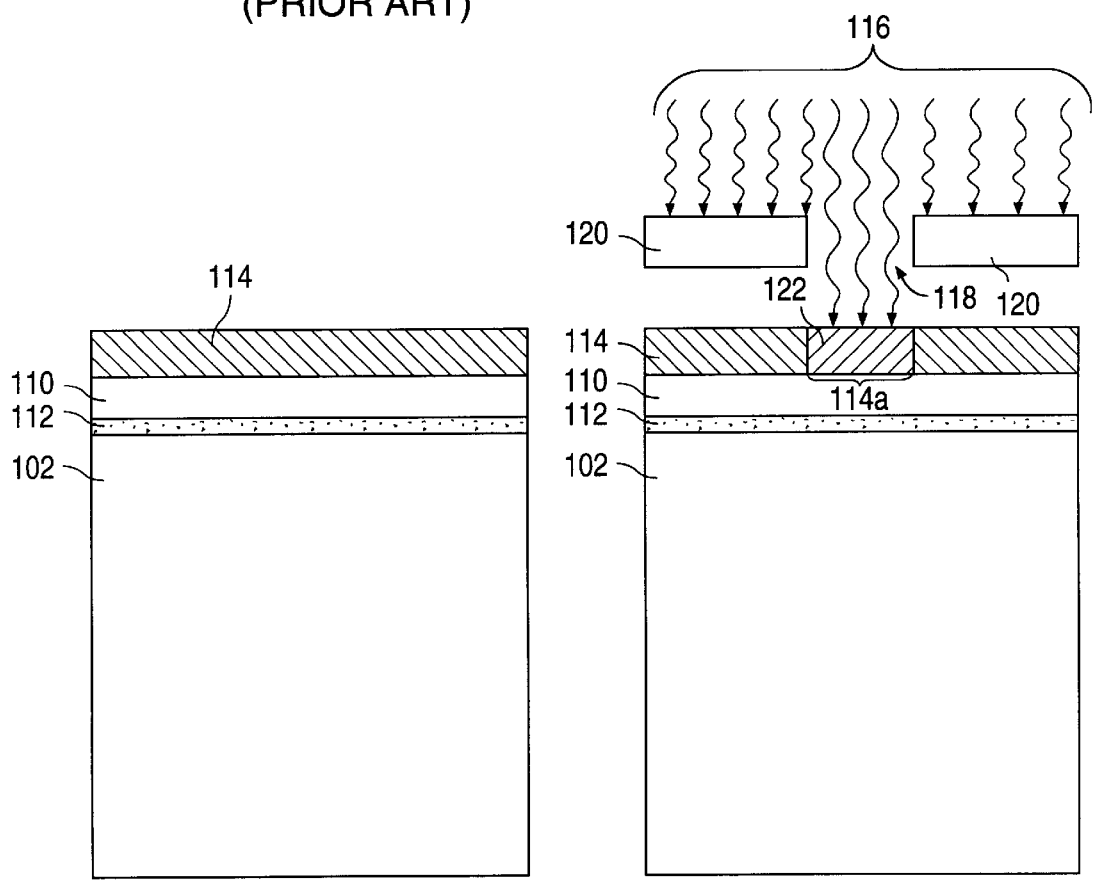
FIG. 2A
(PRIOR ART)
FIG. 2B
(PRIOR ART)

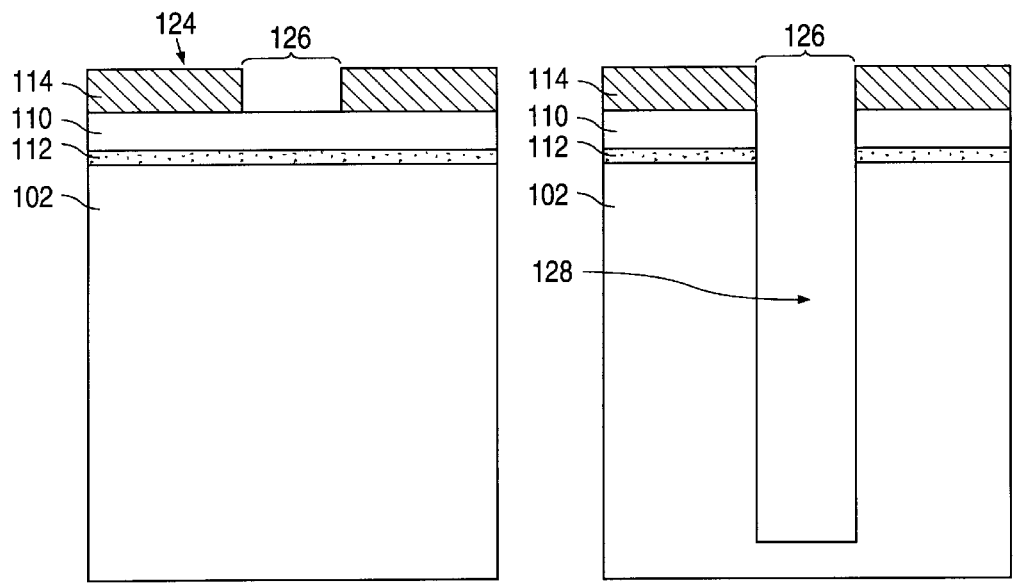
FIG. 2C
(PRIOR ART)
FIG. 2D
(PRIOR ART)
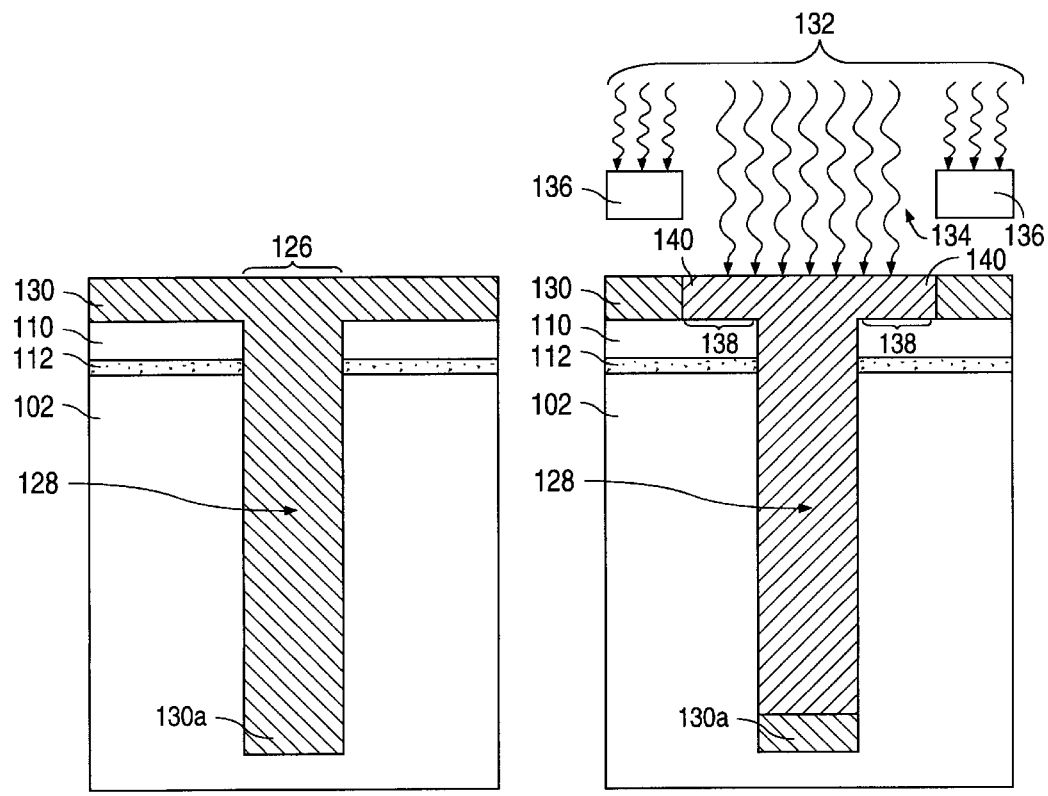
FIG. 2E
(PRIOR ART)
FIG. 2F
(PRIOR ART)

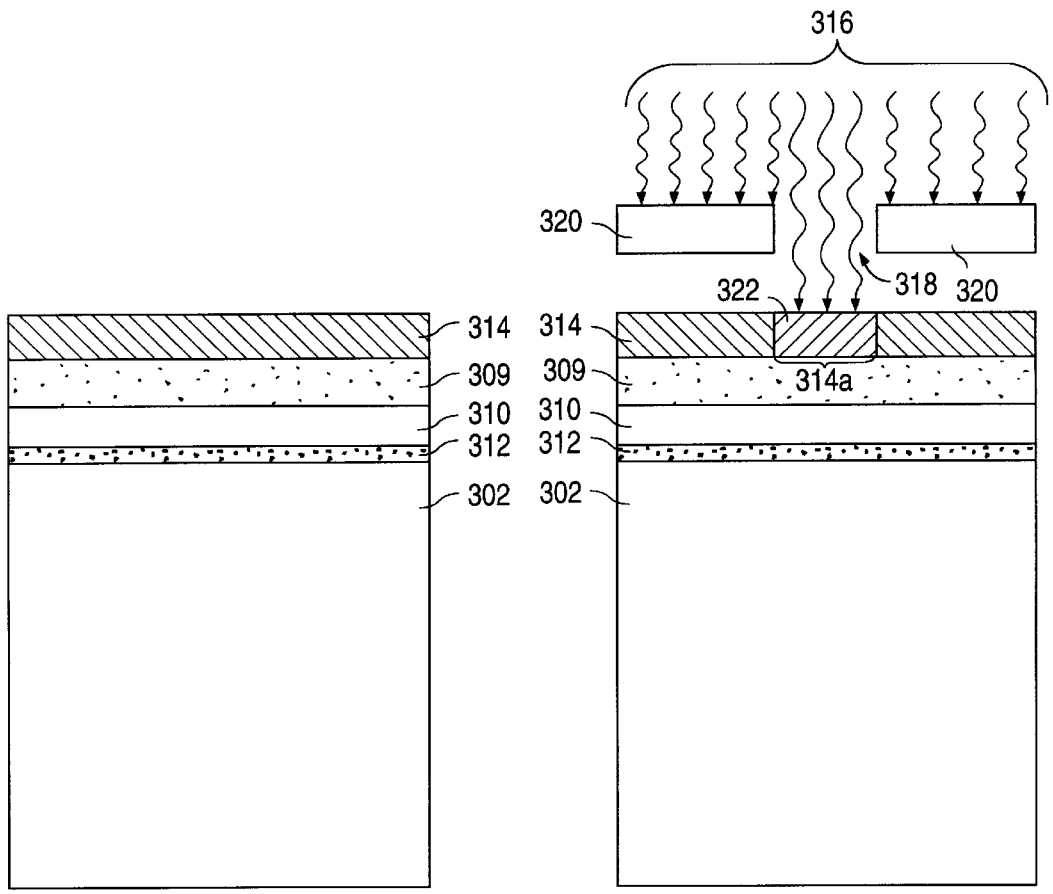
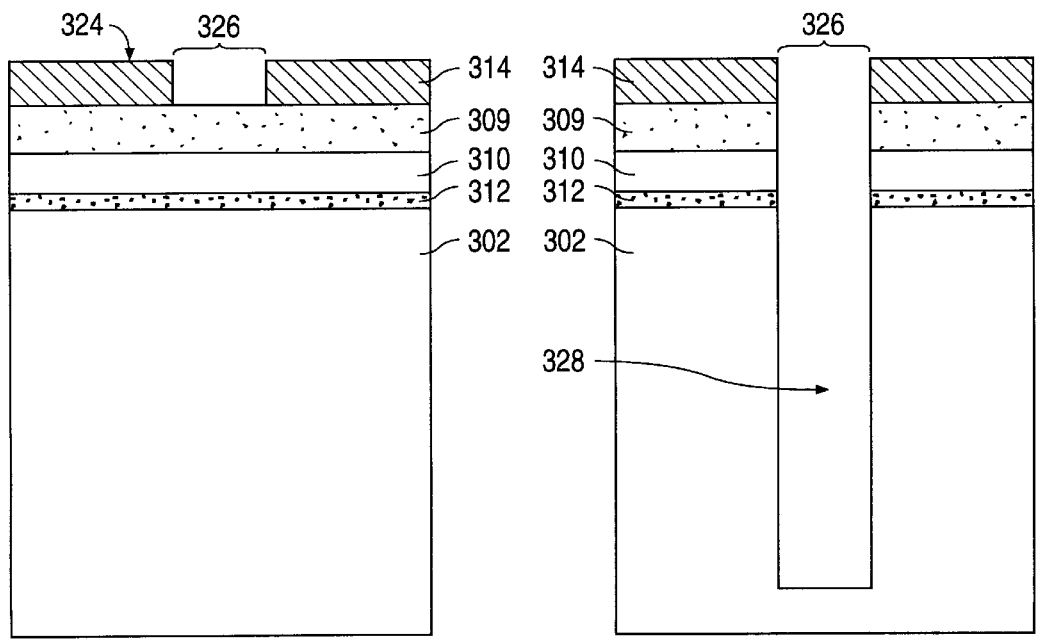
FIG. 3A  FIG. 3B
FIG. 3C  FIG. 3D

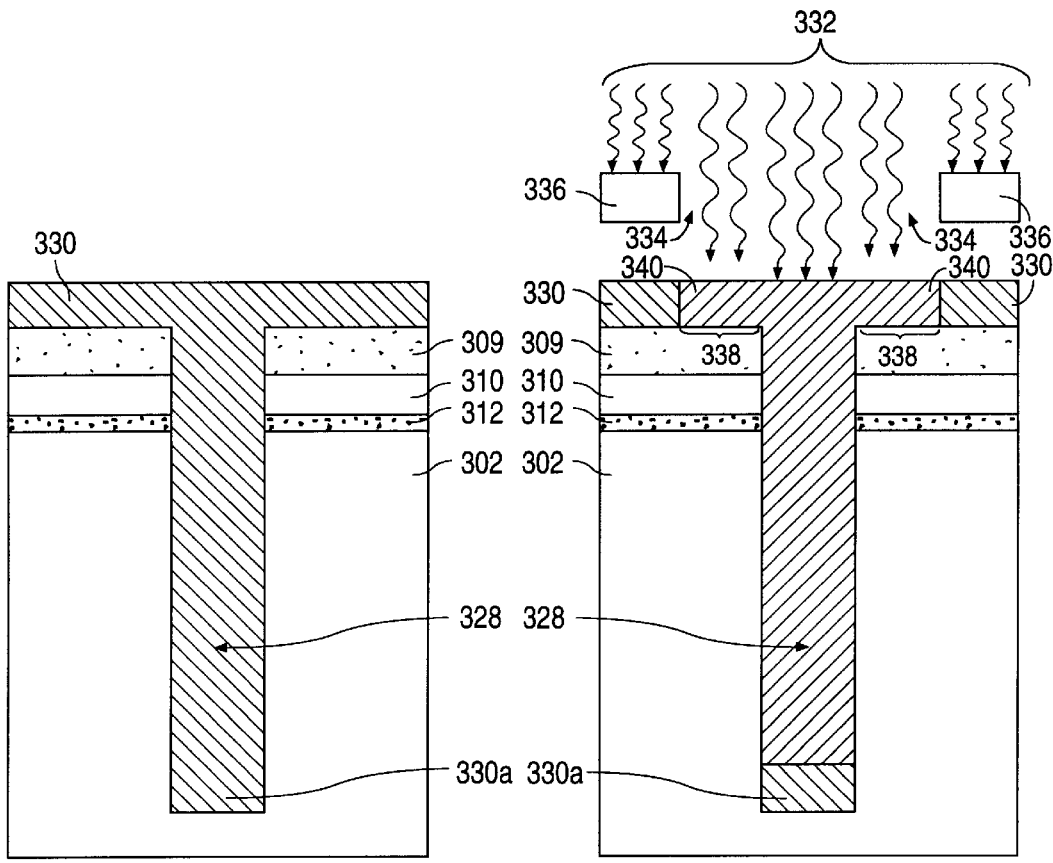
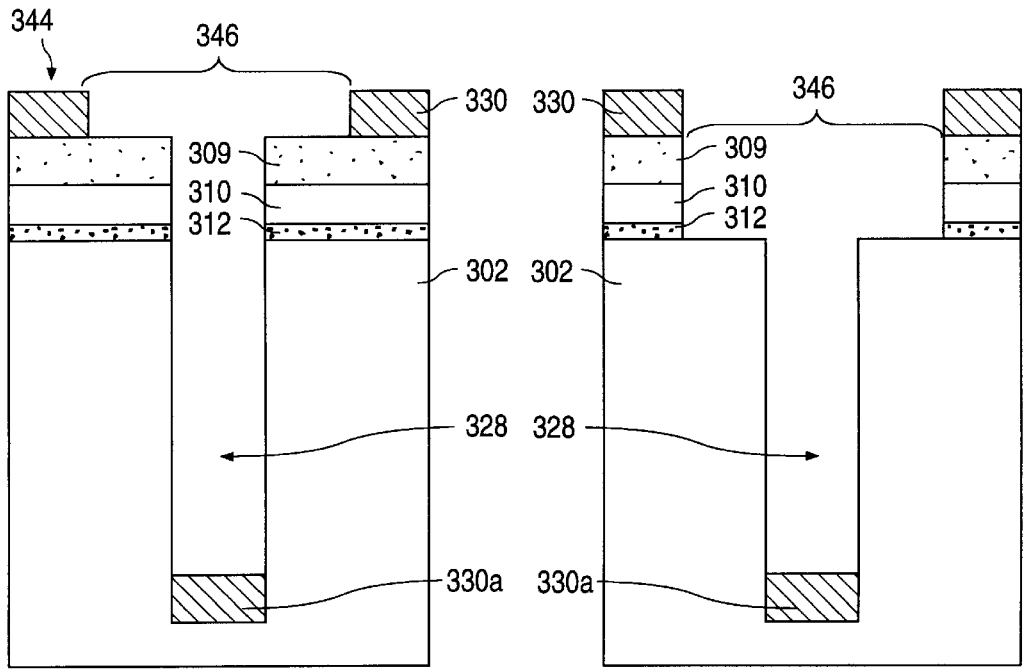

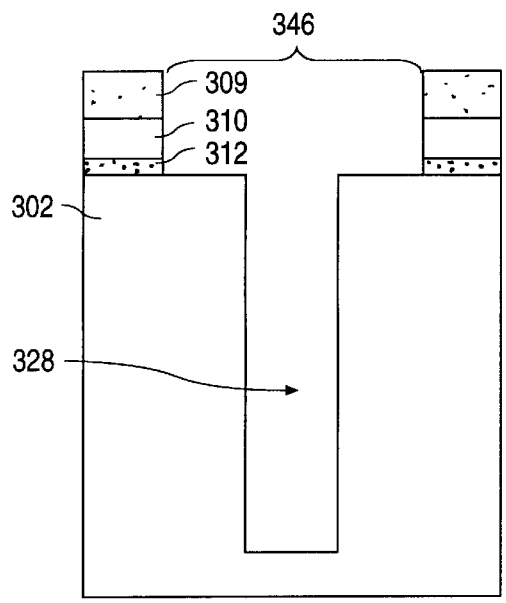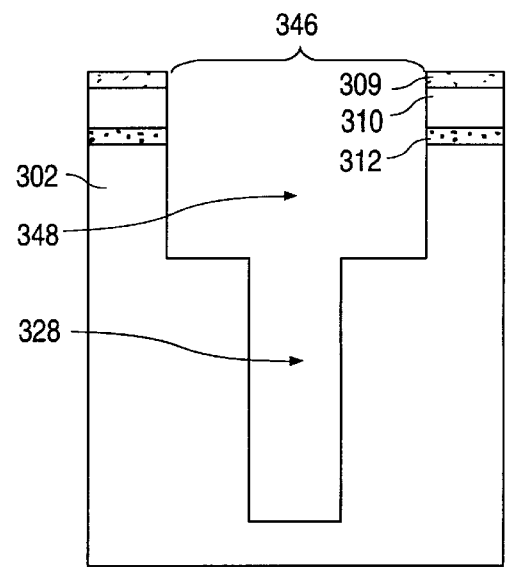
FIG. 3I  FIG. 3J
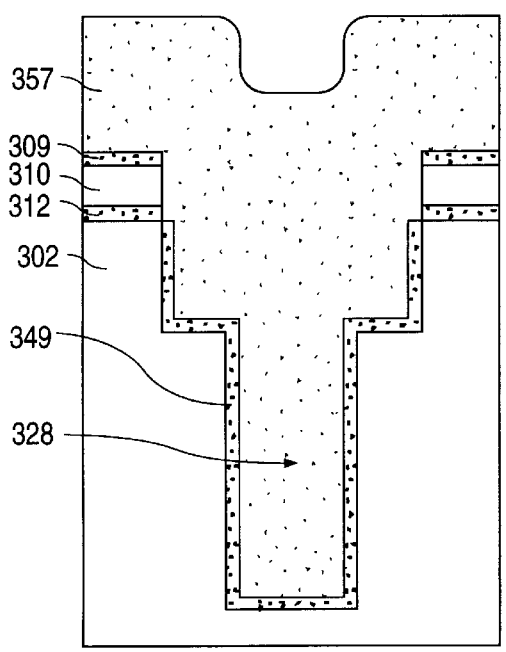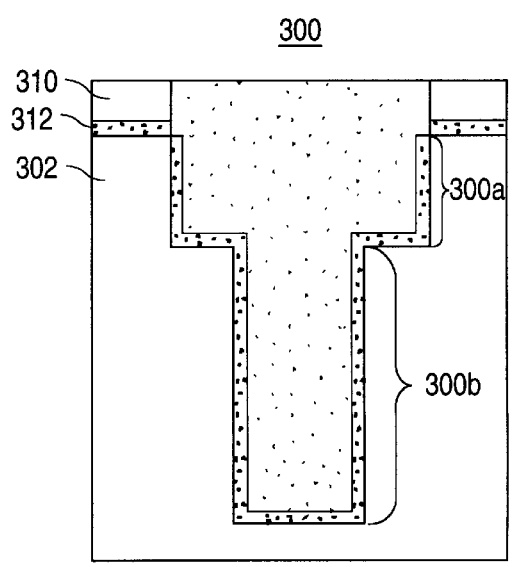
FIG. 3K  FIG. 3L

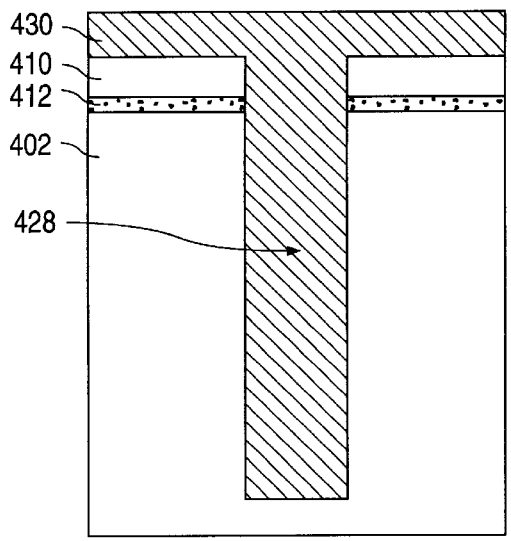
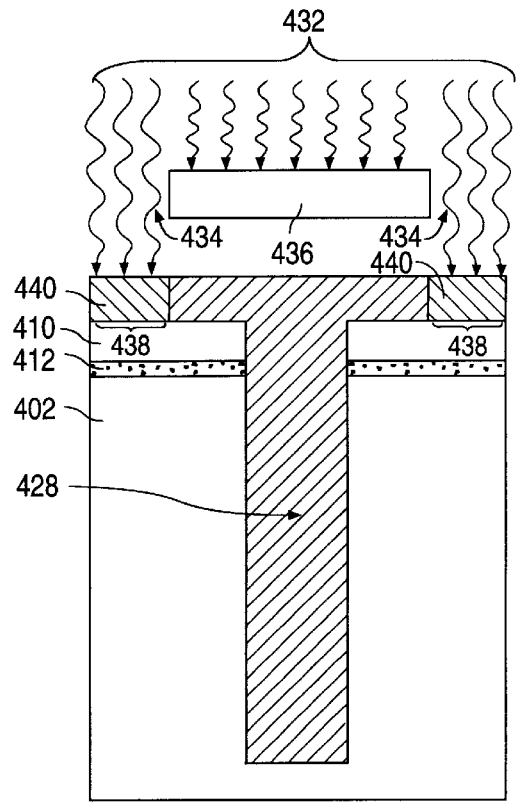
FIG. 4A
FIG. 4B
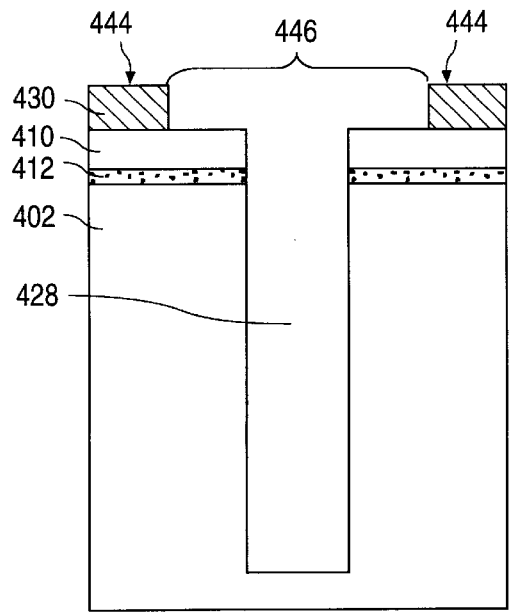
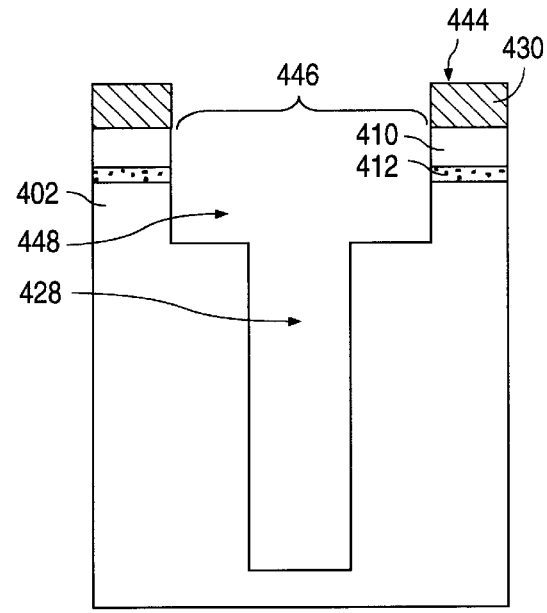
FIG. 4C
FIG. 4D

PROCESS FOR FABRICATING TRENCH ISOLATION STRUCTURE FOR INTEGRATED CIRCUITS

BACKGROUND OF THE INVENTION

1. Field of the Invention

The present invention relates to a process for forming a trench isolation structure for semiconductor devices in an integrated circuit, and in particular, to a process for forming a trench isolation structure wherein shallow trenches overlapping deep trenches are formed without creating defects in the deep trench sidewalls.

2. Description of the Related Art

In semiconductor processing, a typical process requirement is to create trench isolation structures within a semiconductor workpiece. These trench isolation structures are typically filled with dielectric material and electrically isolate semiconductor devices formed in the workpiece from the effects of adjacent active devices.

FIG. 1 shows a cross-sectional view of a conventional trench isolation structure. Trench isolation structure 100 is formed in semiconductor workpiece 102 between first active device 104 and second active device 106. Trench isolation structure 100 includes a shallow component 100a and a deep component 100b. Shallow component 100a typically extends from the surface of the semiconductor workpiece to a depth of between about 0.25 μm and 2.0 μm. Deep component 100b typically extends from the bottom of the shallow component to a depth of between about 1.0 μm and 25 μm in the semiconductor workpiece.

FIGS. 2A–2I show cross-sectional views of the conventional process flow for forming the trench isolation structure of FIG. 1. In FIG. 2A, nitride oxidation mask layer 110 (typically 600–2000 Å thick) is formed over a pad silicon dioxide layer 112 (typically 50–400 Å thick). Pad oxide layer 112 is formed over a semiconductor workpiece composed of single crystal silicon 102. First unexposed positive photoresist layer 114 is then formed over nitride oxidation mask layer 110.

FIG. 2B shows the next step, wherein selected regions 114a of positive photoresist layer 114 are exposed to light 116 through gap 118 in reticle 120. In response to exposure to light 116, unexposed positive photoresist in selected regions 114a undergoes a physical transformation into exposed positive photoresist 122.

FIG. 2C shows the subsequent development step, wherein the wafer is immersed in a solvent in which exposed positive photoresist 122 is soluble, but unexposed positive photoresist 114 is insoluble. As a result of this development step, the exposed positive photoresist dissolves in the solvent and is removed to leave patterned unexposed positive photoresist mask 124 excluding unmasked regions 126.

FIG. 2D shows the next step, wherein nitride oxidation mask layer 110, pad oxide layer 112, and single crystal silicon 102 underlying unmasked region 126 are etched. As a result, deep trench 128 is formed.

FIG. 2E shows the stripping of the first unexposed positive photoresist mask, followed by formation of second unexposed positive photoresist layer 130. As a result of formation of second positive photoresist layer 130, deep trench 128 is filled with unexposed positive photoresist material.

FIG. 2F shows the second photolithography step, wherein second unexposed positive photoresist layer 130 is exposed to light 132 through gap 134 in second reticle 136. In response to exposure to light 132, unexposed positive photoresist 130 in selected regions 138 undergoes a physical transformation into exposed positive photoresist 140. However, because of the depth of deep trench 128, light 132 is prevented from exposing all of the positive photoresist lying within the trench, and bottom positive photoresist portion 130a remains unexposed.

FIG. 2G illustrates the development step, wherein the wafer is immersed in a solvent in which exposed positive photoresist 140 is soluble, but unexposed positive photoresist 130 is insoluble. As a result of this development step, exposed positive photoresist dissolves and is removed to leave patterned unexposed positive photoresist mask 144 revealing unmasked region 146 larger than and including deep trench 128. Unexposed positive photoresist 130a lying at the bottom of deep trench 128 remains in place during this step.

FIG. 2H shows the next step, wherein nitride oxidation mask layer 110, silicon dioxide layer 112, and single crystal silicon 102 underlying unmasked region 146 are exposed to etching. As a result, shallow trench 148 is formed in single crystal silicon 102. FIG. 2H also shows that portion 130a of unexposed positive photoresist lying at the bottom of deep trench 128 interferes with etching during this step, causing etching to occur around periphery of remaining photoresist portion 130a and creating notches 150.

FIG. 2I shows the stripping of the second positive photoresist mask, which also removes the unexposed positive photoresist portion lying at the bottom of deep trench 128. The sidewalls of deep trench 128 and shallow trench 148 are then oxidized to form liner oxide 149. The growth of liner oxide 149 heals defects in single crystal silicon 102 at the trench sidewalls caused by the prior processing steps. Nitride oxidation mask 110 prevents oxidation from occurring outside of trenches 128 and 148 during this step. FIG. 2I also shows the formation of dielectric material 157 (typically CVD silicon dioxide) over the entire surface, including within deep trench 128 and shallow trench 148.

Finally, FIG. 2J shows removal of dielectric material 157 outside of trenches 128 and 148 by CMP to form shallow component 100a overlying deep component 100b. Fabrication of the conventional isolation structure is completed by selectively removing nitride oxidation mask layer 110 relative to underlying pad oxide layer 112. Remaining pad oxide 112 is thin enough to be easily removed without affecting isolation structure 100.

While satisfactory for some applications, the conventional process flow depicted in FIGS. 2A–2J suffers from certain problems. One particularly serious disadvantage of the conventional process is formation of irregularities on the sidewalls of the deep trench during etching of the shallow trench. These irregularities, such as the notches created in FIG. 2H, are caused by interaction between etchant used to form the shallow trench and unexposed positive photoresist remaining at the bottom of the deep trench following shallow trench photolithography. These deep trench sidewall irregularities can give rise to defects in the single crystal silicon and create breakdown voltage pathways between the active devices and the substrate.

Therefore, there is a need in the art for a process for forming an isolation structure featuring deep and shallow components which creates a shallow trench while avoiding formation of a notch or other irregularity in the sidewall of an already-existing deep trench.

SUMMARY OF THE INVENTION

The present invention teaches a process flow for forming a trench isolation structure which avoids creation of deep trench sidewall irregularities attributable to residual unexposed photoresist remaining within the deep trench during shallow trench etching. This is accomplished by performing the shallow trench etch in two stages. In a first stage, the positive shallow trench photoresist mask is patterned over a barrier composed of material different than the underlying single crystal silicon. During this step, some residual photoresist inevitably forms at the bottom of the existing deep trench. Next, using an etch process which etches the barrier material much faster than the single crystal silicon, the barrier is removed in regions exposed by the patterned photoresist to stop on the underlying silicon. The shallow trench photoresist mask is then stripped, removing unexposed photoresist lying at the bottom of the deep trench. In the second etch step, single crystal silicon exposed by removal of the barrier is etched to form the shallow trench. Because unexposed positive photoresist within the deep trenches has already been stripped prior to etching the single crystal silicon, formation of sidewall irregularities within the deep trench is avoided.

In an alternative embodiment of a process in accordance with the present invention, a pattern of negative photoresist rather than positive photoresist is employed to etch the shallow trench. During development of the negative photoresist, unexposed negative photoresist within the deep trench is removed and formation of the shallow trench proceeds without the danger of creating deep trench sidewall irregularities.

A first embodiment of a process in accordance with the present invention comprises the steps of forming a barrier over a semiconductor workpiece, forming a deep trench extending through the barrier to a first depth into the semiconductor workpiece, and forming a positive photoresist layer over the barrier and within the deep trench. The positive photoresist layer is exposed to light in an unmasked area larger than and encompassing the deep trench, and the positive photoresist layer is developed to remove exposed positive photoresist in the unmasked area. The barrier is removed in the unmasked area to stop on the semiconductor workpiece, and the unexposed positive photoresist layer, including unexposed positive photoresist within the deep trench, is stripped. The semiconductor workpiece is then removed in the unmasked area to a second depth shallower than the first depth to form a shallow trench, and dielectric material is then formed within the shallow trench and the deep trench.

A second embodiment of a process in accordance with the present comprises the steps of forming a barrier over a semiconductor workpiece, forming a deep trench extending through the barrier to a first depth into the semiconductor workpiece, and forming a negative photoresist layer over the barrier and within the deep trench. The negative photoresist layer is exposed to light in a masked area excluding the deep trench. The negative photoresist layer is developed to remove unexposed negative photoresist outside of the masked area, including unexposed negative photoresist within the deep trench. The barrier and the semiconductor workpiece are then removed outside of the masked area to a second depth shallower than the first depth to form a shallow trench, and dielectric material is formed within the shallow trench and the deep trench.

The features and advantages of the present invention will be understood upon consideration of the following detailed description of the invention and the accompanying drawings.

BRIEF DESCRIPTION OF THE DRAWINGS

FIG. 1 shows a cross-sectional view of adjacent semiconducting devices separated by a conventional dielectric-filled trench isolation structure.

FIGS. 2A–2J show cross-sectional views of the conventional process flow for forming the trench isolation structure of FIG. 1.

FIGS. 3A–3L show cross-sectional views of a process flow in accordance with one embodiment of the present invention for forming the trench isolation structure of FIG. 1.

FIGS. 4A–4D show cross-sectional views of a process flow in accordance with an alternative embodiment of the present invention for forming the trench isolation structure of FIG. 1.

DETAILED DESCRIPTION

Figure 2G:
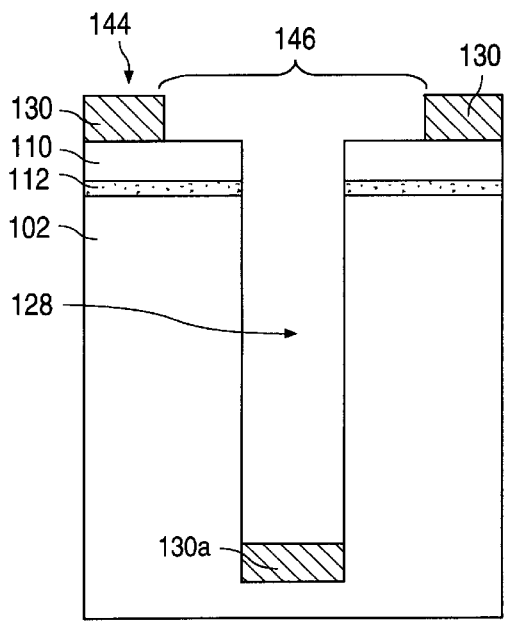
Figure 2H:
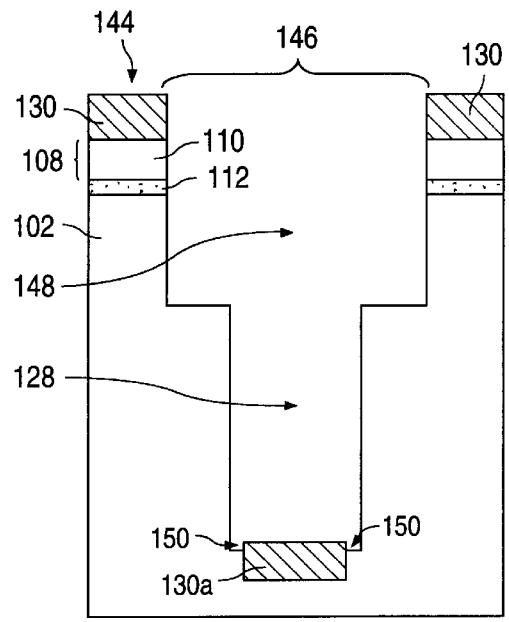
Figure 2I:
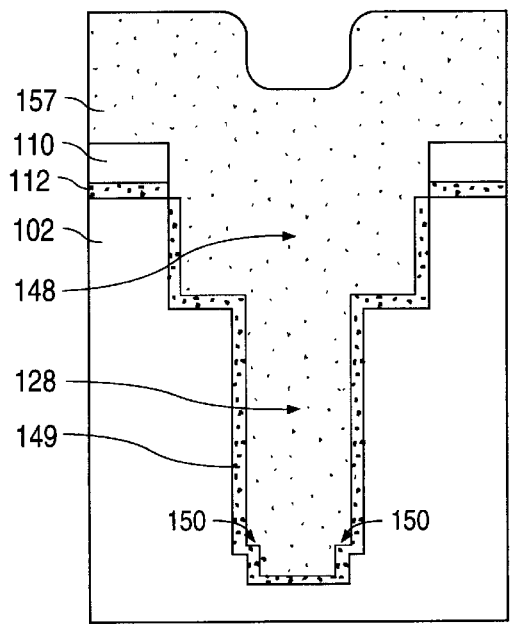
Figure 2J:
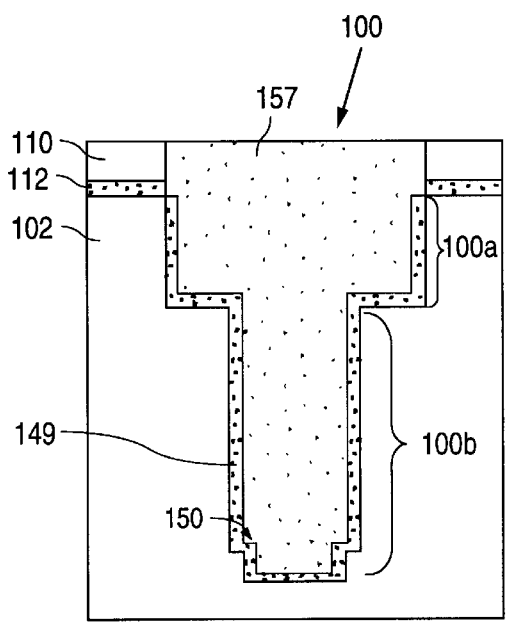

The present invention proposes a process flow for forming an isolation structure including deep and shallow trench components for an integrated circuit, which avoids creating irregularities in the deep trench sidewall during shallow trench formation.

FIGS. 3A–3L show cross-sectional views of a process flow for forming a trench isolation structure in accordance with one embodiment of the present invention.

FIG. 3A shows the starting point, wherein oxide barrier layer 309 (typically 1000–15,000 Å thick) is formed over nitride oxidation mask layer 310 (typically 600–2000 Å thick). Nitride oxidation mask layer 310 in turn overlies pad oxide layer 312 (typically 50 Å–400 Å thick). First unexposed positive photoresist layer 314 is then formed over oxide barrier layer 309.

FIG. 3B shows the next step, wherein selected regions 314a of first positive photoresist layer 314 are exposed to light 316 through gap 318 in reticle 320. In response to exposure to light 316, unexposed positive photoresist in selected regions 314a is physically transformed into exposed positive photoresist 322.

FIG. 3C shows the subsequent development step, wherein the wafer is immersed in a solvent in which exposed positive photoresist 322 is soluble, but unexposed positive photoresist 314 is insoluble. As a result of this development step, the exposed positive photoresist is removed to leave patterned unexposed positive photoresist mask 324 excluding unmasked regions 326.

FIG. 3D shows the next step, wherein oxide barrier layer 309, nitride oxidation mask layer 310, pad oxide layer 312, and single crystal silicon 302 underlying unmasked region 326 are exposed to etching. As a result of this etching, deep trench 328 is formed in single crystal silicon 302.

FIG. 3E shows the stripping of the unexposed first positive photoresist mask, followed by formation of second unexposed positive photoresist layer 330. As a result of formation of second positive photoresist layer 330, deep trench 328 is filled with unexposed photoresist material.

FIG. 3F shows the second photolithography step, wherein second unexposed positive photoresist layer 330 is exposed to light 332 through gap 334 in second reticle 336. In response to exposure to light 332, unexposed positive photoresist in selected regions 338 undergoes a physical transformation into exposed positive photoresist 340. However, because of the depth of deep trench 328, light 332 is prevented from exposing all of the positive photoresist lying within the deep trench, and bottom photoresist portion 330a remains unexposed.

FIG. 3G illustrates the development step, wherein the wafer is immersed in a solvent in which exposed positive photoresist 340 is soluble, but unexposed positive photoresist 330 is insoluble. As a result of this development step, the exposed positive photoresist is removed to leave patterned unexposed positive photoresist mask 344 revealing unmasked region 346 larger than and including deep trench 328. Unexposed positive photoresist 330a lying at the bottom of deep trench 328 remains in place.

FIG. 3H shows the first shallow trench etching step, wherein portions of oxide barrier layer 309, nitride oxidation mask layer 310, and pad oxide layer 312 underlying unmasked region 346 are exposed to etchant which removes these materials much more quickly than underlying single crystal silicon 302. As a result of this etching, window 346 is formed, but single crystal silicon 302 and unexposed positive photoresist 330 remain unaffected.

FIG. 3I shows the photoresist stripping step, wherein all remaining portions of the second unexposed photoresist mask are removed, including the unexposed positive photoresist lying at the bottom of deep trench 328.

FIG. 3J shows the second shallow trench etching step, wherein single crystal silicon 302 exposed by the prior etching of layers 309, 312, and 310 is exposed to etchant which removes single crystal silicon at a much faster rate than the barrier layer. As a result of this second etch step, shallow trench 348 is formed in single crystal silicon 302. Some widening and deepening of deep trench 328 also results from this etching.

Because the second photoresist mask has now been stripped, all remaining portions of oxide barrier layer 309 are exposed to etchant during this step. Because it is necessary to preserve silicon nitride oxidation mask 310 to prevent oxidation during the subsequent growth of the trench liner oxide, the process flow of FIGS. 3A–3J requires the presence of sacrificial oxide barrier layer 309. Oxide barrier layer 309 is intended to be consumed while protecting underlying nitride oxidation mask 310.

FIG. 3K shows stripping of the second positive photoresist mask, followed by exposure to oxidizing conditions to form trench liner oxide 349 on the trench sidewalls. Nitride oxidation mask 310 prevents oxidation from occurring outside of the trench during this step. Dielectric material 357 (typically CVD silicon dioxide) is then formed within deep trench 328 and shallow trench 348.

Finally, FIG. 3L shows removal of dielectric material 357 outside trenches 328 and 348 by chemical-mechanical polishing, to form shallow isolation component 300a overlying deep isolation component 300b. This CMP step removes any remaining portions of oxide barrier layer 309. The endpont of this CMP process may be revealed when the CMP pad encounters remaining nitride oxidation mask layer 310. Alternatively, this chemical-mechanical polishing may be a timed process Fabrication of the isolation structure is completed by selectively removing nitride layer 310 relative to underlying pad oxide 312. Pad oxide 312 is thin enough to be easily removed without harming isolation structure 300.

The process flow in accordance with the present invention offers a number of important advantages over conventional trench formation processes.

One important advantage of the process in accordance with the present invention is prevention of formation of irregular features along the sidewalls of the deep trench during etching of the shallow trench. This is accomplished by etching the shallow trench in two steps. First, the overlying oxide barrier is etched selective to the underlying single crystal silicon, and then single crystal silicon is etched in regions exposed by removal of the barrier. Between these discrete etching steps, unexposed positive photoresist formed within the deep trench is stripped, preventing unwanted interaction with etchant giving rise to deep trench sidewall irregularities.

Another advantage offered by the process described above in FIGS. 3A–3L is that the nitride oxidation mask may provide a detectable endpoint for the final CMP process. This can ensure that the isolation structure is not degraded during removal of the overlying oxide during the final CMP step.

Although the present invention has so far been described in conjunction with one specific embodiment, the invention should not be limited to this particular embodiment. Various modifications and alterations in the process will be apparent to those skilled in the art without departing from the scope of the present invention.

For example, while FIGS. 3A–3L describe a process flow employing a positive photoresist mask to form the shallow trench, this is not required by the present invention. FIGS. 4A–4D show cross-sectional views of a process flow in accordance with an alternative embodiment of the present invention, wherein a negative photoresist mask is employed to etch the shallow trench.

The steps leading up to FIG. 4A are identical to those described in conjunction with FIGS. 2A–2D, wherein deep trench 428 is etched through nitride oxidation mask layer 410 overlying pad oxide layer 412 into underlying single crystal silicon 402.

After stripping the deep trench photoresist mask, FIG. 4A shows formation of negative photoresist layer 430 over nitride oxidation mask layer 410. As a result of formation of negative photoresist layer 430, deep trench 428 is filled with unexposed negative photoresist material.

FIG. 4B shows the next step, wherein selected regions 438 of negative photoresist layer 430 are exposed to light 432 through gaps 434 in reticle 436. In response to light 432, unexposed negative photoresist in selected regions 438 undergo a physical transformation into exposed negative photoresist 440.

FIG. 4C shows the subsequent development step, wherein the wafer is immersed in a solvent in which unexposed negative photoresist 430 is soluble, but exposed negative photoresist 440 is insoluble. As a result of this development step, the unexposed negative photoresist is removed to leave patterned exposed negative photoresist mask 444 revealing unmasked region 446. Because of the character of negative photoresist material, all of the unexposed negative photoresist lying in deep trench 428 is removed during this development step.

FIG. 4D shows the next step in the process flow, wherein nitride oxidation mask layer 410, pad oxide layer 412, and single crystal silicon 402 underlying unmasked region 446 are exposed to etching. As a result of this etching, shallow trench 448 is formed in single crystal silicon 402.

Fabrication of the isolation structure is completed by creating a trench oxide liner layer, forming dielectric material within the deep and shallow trenches, and then removing this dielectric material outside of the trenches by CMP.

The alternative embodiment of the process in accordance with the present invention offers a number of advantages over the first embodiment. Specifically, the alternative embodiment employs fewer processing steps because unexposed negative photoresist within the deep trench is naturally removed during development. However, this alternative embodiment requires the use of negative photoresist material enjoying limited use and availability.

Given the above detailed description of the invention and the variety of embodiments described therein, it is intended that the following claims define the scope of the present invention, and that the structures and processes within the scope of these claims and their equivalents be covered hereby.

What is claimed is:

1. A process for forming a trench isolation structure comprising the steps of:

forming a barrier over a semiconductor workpiece;

forming a deep trench extending through the barrier to a first depth into the semiconductor workpiece;

forming a positive photoresist layer over the barrier and within the deep trench;

exposing the positive photoresist layer to light in an unmasked area larger than and encompassing the deep trench;

developing the positive photoresist layer to remove exposed positive photoresist in the unmasked area;

removing the barrier in the unmasked area to stop on the semiconductor workpiece;

stripping the unexposed positive photoresist layer, including unexposed positive photoresist within the deep trench;

removing the semiconductor workpiece in the unmasked area of the semiconductor workpiece to a second depth shallower than the first depth to form a shallow trench; and forming dielectric material within the shallow trench and the deep trench.

2. A process according to claim 1 wherein the semiconductor workpiece comprises single crystal silicon and wherein the step of forming a barrier comprises:

forming a pad oxide layer over the single crystal silicon;

forming a nitride layer over the pad oxide layer; and forming an etch mask oxide layer over the nitride layer.

3. A process according to claim 2 wherein:

the step of removing the semiconductor workpiece in the unmasked area comprises removing single crystal silicon in the unmasked area while removing the etch mask outside of the unmasked area;

the step of forming dielectric material within the semiconductor workpiece comprises the steps of forming dielectric material over the entire surface including within the deep and shallow trenches, and then removing dielectric material outside of the deep and shallow trenches by chemical-mechanical polishing to stop on the nitride layer; and wherein the process further comprises the step of selectively removing the nitride layer relative to the pad oxide layer after chemical-mechanical polishing.

4. A process according to claim 3 wherein:

the step of removing the semiconductor workpiece in the unmasked area comprises subjecting the single crystal silicon in the unmasked area and the etch mask outside of the unmasked area to etching in which the single crystal silicon is removed more quickly than the etch mask oxide layer; and the step of forming an etch mask oxide layer comprises forming an etch mask oxide layer having a thickness substantially consumed during subsequent removal of single crystal silicon within the unmasked area.

5. A process according to claim 4 wherein the thickness of the etch mask oxide layer is sufficient to prevent etching of the nitride layer during the step of removing the single crystal silicon in the unmasked area.

6. A process according to claim 5 wherein:

the step of forming the etch mask oxide layer comprises forming an oxide layer between about 1000 Å and 15,000 Å thick;

the step of forming the nitride layer comprises forming a nitride layer between about 600 Å and 2000 Å thick;

the step of forming the pad oxide layer comprises forming a pad oxide layer between about 50 Å and 400 Å thick;

the step of removing the single crystal silicon to a first depth comprises removing single crystal silicon to a depth of between about 1 $\mu$m and 25 $\mu$m; and the step of removing single crystal silicon to a second depth comprises removing single crystal silicon to a depth of between about 0.25 $\mu$m and 2 $\mu$m.

7. A process for forming a trench isolation structure comprising the steps of:

forming a barrier over a semiconductor workpiece;

forming a deep trench extending through the barrier to a first depth into the semiconductor workpiece;

forming a negative photoresist layer over the barrier and within the deep trench;

exposing the negative photoresist layer to light in a masked area excluding the deep trench;

developing the negative photoresist layer to remove unexposed negative photoresist outside of the masked area, including unexposed negative photoresist within the deep trench;

removing the barrier and the semiconductor workpiece outside of the masked area to a second depth shallower than the first depth to form a shallow trench; and forming dielectric material within the shallow trench and the deep trench.

8. A process according to claim 7 wherein the semiconductor workpiece comprises single crystal silicon and wherein the step of forming a barrier comprises:

forming a pad oxide layer over the single crystal silicon; and forming a nitride layer over the pad oxide layer.

9. A process according to claim 8 wherein:

the step of forming dielectric material within the semiconductor workpiece comprises the steps of forming dielectric material over the entire surface including within the deep and shallow trenches, and then removing dielectric material outside of the deep and shallow trenches by chemical-mechanical polishing to stop on the nitride layer; and wherein the process further comprises the step of selectively removing the nitride layer relative to the pad oxide layer after chemical-mechanical polishing.

10. A process according to claim 9 wherein:

the step of forming the nitride layer comprises forming a nitride layer between about 600 Å and 2000 Å thick;

the step of forming the pad oxide layer comprises forming a pad oxide layer between about 50 Å and 400 Å thick;

the step of removing the single crystal silicon to a first depth comprises removing single crystal silicon to a depth of between about 1 $\mu$m and 25 $\mu$m; and the step of removing single crystal silicon to a second depth comprises removing single crystal silicon to a depth of between about 0.25 $\mu$m and 2 $\mu$m.

11. A process for creating in a semiconductor workpiece a shallow trench surrounding a deep trench, the process comprising the steps of:

forming a barrier over a semiconductor workpiece, the barrier composed of material different than the semiconductor workpiece;

forming a deep trench by etching through the barrier into the semiconductor workpiece;

patterning a photoresist mask over the semiconductor workpiece, a portion of the photoresist mask remaining within the deep trench;

utilizing the photoresist mask to remove the barrier selective to the semiconductor workpiece in a precursor shallow trench region larger than and encompassing the deep trench;

removing the photoresist mask from within the deep trench; and utilizing remaining portions of the barrier layer to form a shallow trench in the semiconductor workpiece in the precursor shallow trench region after removal of the photoresist mask from within the deep trench.

12. The process according to claim 11 wherein:

the step of patterning a photoresist mask comprises patterning a positive photoresist mask; and the step of removing the photoresist mask from within the deep trench comprises stripping the positive photoresist mask after the step of removing the barrier selective to the semiconductor workpiece, and before the step of etching the shallow trench.

13. A process according to claim 12 wherein the semiconductor workpiece comprises single crystal silicon, and wherein the step of forming the barrier comprises the steps of:

forming a pad oxide layer over the single crystal silicon;

forming a nitride layer over the pad oxide layer; and forming an etch mask oxide layer over the nitride layer.

14. A process according to claim 13 wherein a thickness of the etch mask oxide layer is sufficient to prevent etching of the nitride layer during the step of forming the shallow trench.

15. The process according to claim 11 wherein:

the step of patterning a photoresist mask comprises patterning a negative photoresist mask; and the step of removing the photoresist mask from within the deep trench comprises developing the negative photoresist before the step of removing the barrier selective to the semiconductor workpiece and after the step of etching the shallow trench.

16. A process according to claim 15 wherein the semiconductor workpiece comprises single crystal silicon, and wherein the step of forming the barrier comprises the steps of:

forming a pad oxide layer over the single crystal silicon; and forming a nitride layer over the pad oxide layer.

* * * * *